United States Patent [19]

Brown

[11] 4,419,624

[45] Dec. 6, 1983

[54] APPARATUS FOR PHASE MEASUREMENT

[75] Inventor: Morton E. Brown, San Antonio, Tex.

[73] Assignee: Southern Gas Association, Dallas, Tex.

[21] Appl. No.: 246,715

[22] Filed: Mar. 23, 1981

[51] Int. Cl.³ .......................................... G01R 25/00
[52] U.S. Cl. ............................... 324/83 D; 364/803; 324/83 A
[58] Field of Search ................ 324/83 R, 83 A, 83 D; 364/803; 73/659

[56] References Cited

U.S. PATENT DOCUMENTS

| | | | |
|---|---|---|---|
| 2,936,041 | 5/1960 | Sharp et al. | 181/206 |
| 2,951,638 | 9/1960 | Hughes et al. | 364/803 |
| 2,979,940 | 4/1961 | Damewood et al. | 73/659 |
| 2,997,124 | 8/1961 | Damewood et al. | 181/233 |
| 3,553,596 | 1/1971 | Thompson et al. | 324/83 A |
| 3,663,956 | 5/1972 | Purdy | 324/83 D |
| 3,760,270 | 9/1973 | Irvin | 324/83 D |
| 3,820,022 | 6/1974 | Watt | 324/83 D |

Primary Examiner—Michael J. Tokar
Attorney, Agent, or Firm—Hubbard, Thurman, Turner & Tucker

[57] ABSTRACT

An improved phase indicator measures the phase difference between a sinusoidal reference signal and a shaped signal having the same frequency. Means are provided for generating a first pulse which begins when the shaped signal makes a positive going transition past a selected voltage level, and ends when the reference signal makes a positive going transition past the zero reference level. A second pulse begins at the end of the first pulse, and ends when the shaped signal makes a negative transition past the selected level. The relative phase of the two signals are adjusted until the first and second pulses are the same length, which occurs when the two signals are 90 degrees out of phase. An indicator is then calibrated to read 90 degrees, and thereafter indicates the correct phase relationship between the two signals.

5 Claims, 3 Drawing Figures

APPARATUS FOR PHASE MEASUREMENT

BACKGROUND OF THE INVENTION

The present invention relates generally to an electrical analog of a pumping system and more specifically to an improved device for measuring the phase relationship between two signals.

Installation or modification of natural gas or other fluid distribution systems requires consideration of a number of factors before work is undertaken. Variations in loads, distribution paths, pipe sizes and compressor speeds all have effects on the operation of the system as a whole. Compression waves created in the gas by the operation of reciprocating pumps and compressors are especially troublesome, as fluid acoustic resonances can be set up in the system. These resonances increase metal fatigue and shorten the life of joints, valves and other components of the system.

To assist in planning for control of pulsations and vibrations, an electrical analog of all fluid transfer components can be created. Present electrical systems analogize current to mass flow of the gas and voltage to pressure. Inductors, capacitors and resistors are used to model the mechanical properties of pipes and other components in the distribution system. A detailed model of a distribution system or sub-system can be set up and studied to predict the effects caused by changing various parameters in the operation of the system. Examples of the use of gas pumping system analogs are found in U.S. Pat. Nos. 2,951,638 and 2,979,940.

In order to utilize easily obtained components, the operating frequency of the electrical analog is typically substantially higher than that of the mechanical system. An electrical to mechanical frequency ratio describes this relationship, which can be in the neighborhood of 1,000 to 1. Component values and analog system parameters are chosen so that all events which occur during the operation of the model reflect events which will take place in a mechanical system. For example, the presence of an electrical resonance in the analog system at a certain frequency corresponds to an acoustical resonance at the corresponding mechanical speed.

One model of a reciprocating compressor or pump includes a capacitor which is driven by a sinusoidal voltage source. Due to inaccuracies in the use of a fixed capacitor to model the changing volume of a compressor cylinder, the driving signal must be shaped to insure that the electrical model gives accurate results. The amount of phase shift introduced into the driving signal by the shaping circuit is generally not accurately determinable.

To accurately model a multi-cylinder compressor, it is necessary that the driving signals into the various cylinders have a phase relationship equal to that of the mechanical system. When different cylinders are of different sizes, as is often the case, different wave shaping circuits must be employed, which makes phase measurements of the unshaped driving signal especially inappropriate.

At present, two methods are commonly used for determining the phase of each shaped signal relative to the reference signal. The first consists of measuring the phase difference between the unshaped driving signal and the reference signal with a conventional phasemeter. As mentioned above, this type of measurement is inaccurate for multi-cylinder compressors, where the subsequent phase shift may be different in the shaping circuit for each cylinder. A conventional phasemeter cannot be used directly on the shaped driving signal because the phase of the shaped signal cannot be determined from a zero crossing. Instead, it can only be determined from the positive peaks in the shaped signal, which correspond to the top-dead-center position of the mechanical piston.

A second method is the measurement of the pressure-time waveforms at the output of each model cylinder and a conventional phasemeter. This method is accurate only so long as the operating conditions on each cylinder are identical, which is rarely the case.

It would be desirable to have a phase indicating instrument which measures the phase relationship between a sinusoidal and a non-sinusoidal signal. With such an instrument, it would be possible to directly measure the phase between the reference signal and the shaped driving signal.

SUMMARY OF THE INNVENTION

It is therefore an object of the present invention to provide a new and improved phase measuring device which accurately indicates the phase difference between a sinusoidal reference signal and a shaped driving signal having the same frequency.

It is a further object of the present invention to provide a new and improved phasemeter which can give a precise indication of a 90 degree phase shift between a sinusoidal signal and a shaped waveform.

It is another object of the present invention to provide a new and improved phase indicator which provides a continuous digital readout of the phase difference between the two waveforms.

According to the present invention, means are provided for generating pulses at various transitions of both waveforms past a pre-selected voltage level. A first pulse begins at a positive transition of the shaped signal, and ends at a positive transition of the sinusoidal signal. A second pulse begins at the positive transition of the sinusoidal signal and ends at a negative transition of the non-sinusoidal signal.

The relative phase between the two signals is adjusted until the first and second pulses have the same length. These pulses are preferably compared in a null reading meter, which provides a zero output when the pulses are the same length. Means are preferably provided for insuring that these pulses are only the same length when the two signals are 90 degrees out of phase.

When the two signals are adjusted so that they are 90 degrees out of phase, the device is calibrated so that an output device indicates 90 degrees. This output device is preferably a digital indicator. When the phase of the shaped signal is changed, the relationship between the two signals will be continuously displayed on the output device. The shaped signal can then be adjusted to the required phase which has been determined from the mechanical system.

The novel features which characterize the present invention are defined by the appended claims. The foregoing and other objects and advantages of the invention will hereinafter appear, and for purposes of illustration, but not of limitation, a preferred embodiment is shown in the accompanying drawings.

DESCRIPTION OF THE PREFERRED EMBODIMENT

Figure 1:
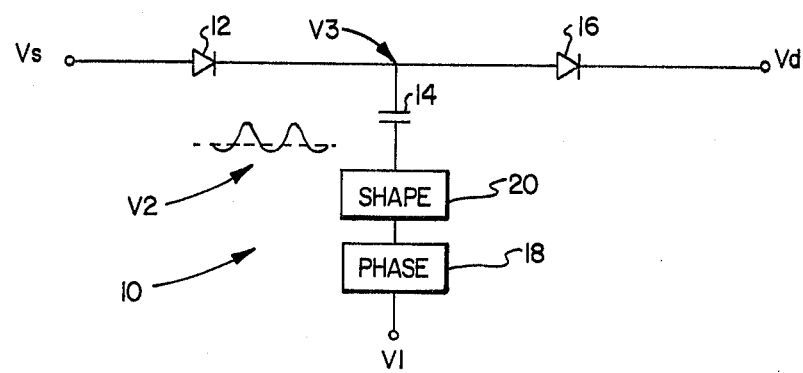
FIG. 1 is a schematic diagram of an electrical model of a reciprocating gas compressor.

Referring to FIG. 1, one model of a reciprocating gas compressor is indicated generally by the reference numeral 10. It is understood that the device of the present invention can be used with different models, and that the model of FIG. 1 is used only as an illustration. For an explanation of the manner in which models of this type correspond to a physical compressor, see for example, U.S. Pat. No. 2,951,638.

An intake diode 12 models the action of an intake valve by allowing current to flow only from the intake piping into the cylinder of a compressor, which is modeled by a capacitor 14. A discharge diode 16 models a discharge valve of the compressor by allowing current to flow only from the capacitor 14 to the discharge piping. Static pressure in the suction piping is modeled by a fixed voltage Vs, while Vd models the static discharge pressure.

The mechanical driving force into the compressor is simulated by a sinusoidal driving signal voltage V1. The analog 10 models only the action in a single cylinder of a compressor, while most compressors have a plurality of cylinders. It will be appreciated by those skilled in the art that a plurality of these models can be operated simultaneously to model the operation of a multi-cylinder compressor. It will be further appreciated that the voltage V1, which models the power input to the crankshaft of the compressor, can be used to drive all of the analog cylinders in the model.

In a multi-cylinder compressor, each cylinder operates at a different phase from the others. This phase is fixed by the location of the attachment of the connecting rod for each cylinder to the crankshaft. To accurately model the operation of a multi-cylinder compressor, it is therefore necessary that the phase of the driving signal to each cylinder 10 be variable with respect to the common driving signal V1. Therefore, an adjustable phase shifting circuit 18 is included in the single cylinder model 10.

The capacitor 14 models the action of the cylinder itself. As the capacitor 14 has a fixed value, and the cylinder volume is constantly changing, inaccuracies are introduced into the model 10. To compensate for these inaccuracies, it is necessary to change the shape of the driving signal waveform somewhat. This is accomplished in a shaping circuit 20. The waveform out of the shaping circuit 20 is that shown as V2, which can be approximately described as a sinusoidal signal having positive and negative lobes of unequal size.

The analog 10 is a charge pump which transfers current from a lower to a higher voltage. When both diodes 12 and 16 are non-conducting, the voltage across the capacitor 14 remains fixed. Since voltage V2 is varying, voltage V3, which corresponds to the pressure of gas in the mechanical cylinder, also varies.

When V3 is between Vs and Vd, both diodes 12, 16 are in the off state, and V3 tracks the changing driving signal V2. When V3 falls low enough to bring V2 slightly below the static suction voltage Vs, intake diode 12 turns on, and current charges the capacitor 14. The cylinder pressure voltage V3 cannot fall below Vs by more than the turn-on voltage of intake diode 12, so that the capacitor 14 charges until V2 reaches its minimum value. When the shaped driving signal V2 increases, V3 increases above Vs and turns the intake diode 12 off. V3 increases until it becomes slightly larger than Vd, which causes the discharge diode 16 to turn on. V3 cannot rise above this value, so the capacitor 14 discharges through the diode 16 as V3 increases. When V2 begins to fall, V3 drops below Vd and discharge diode 16 turns off. V3 continues to drop with V2 until it reaches V2, at which point the suction diode 12 turns on and the cycle repeats.

The wave shaping circuit 20 introduces an unpredictable phase shift into the shaped driving signal V2. As indicated above, it is important that the relative phases of shaped driving signals into the various cylinders be set at an accurately determined value. The phase shift between the various analog cylinders is the same as that between the real life cylinders, and for the model to function properly it is necessary that these phase shifts be set accurately.

Figure 2:
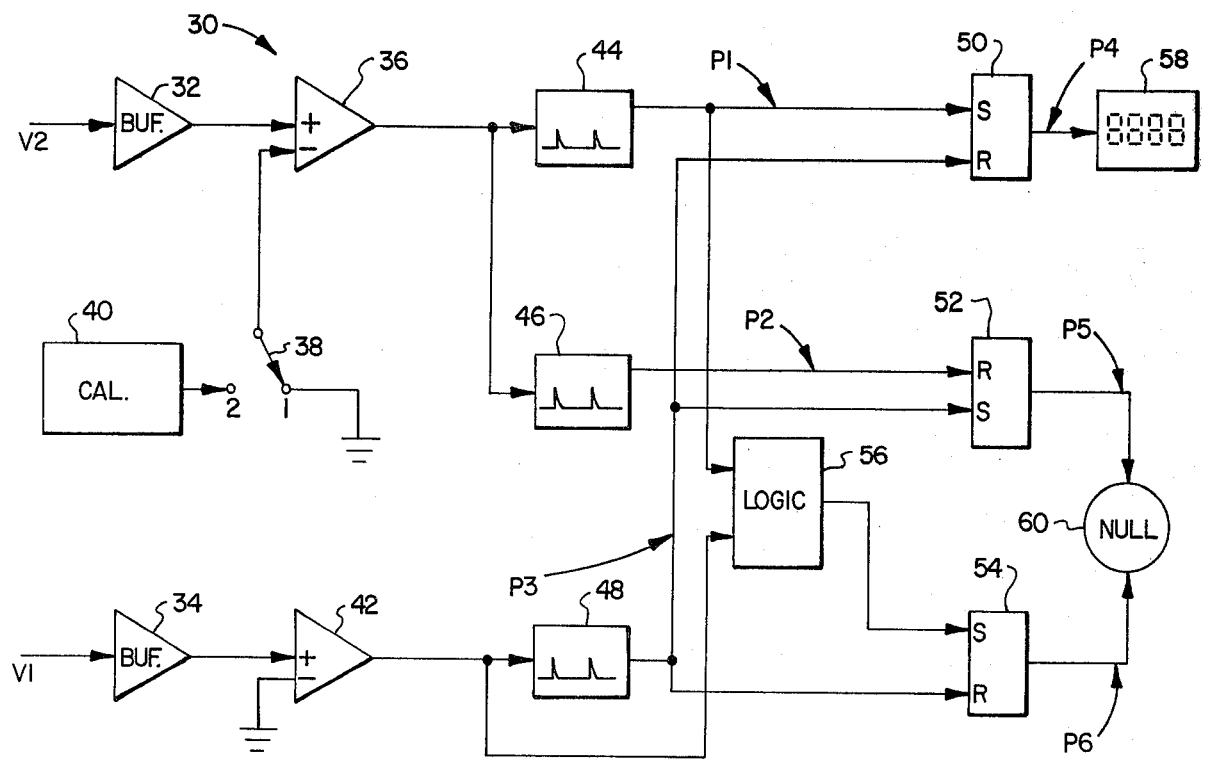
FIG. 2 is a schematic block diagram of an improved device for measuring the phase difference between two periodic signals; and, FIG. 3 is a timing diagram depicting voltage waveforms associated with the device of FIG. 2.

Referring to FIG. 2, an improved device for measuring the relative phases of the sinusoidal driving signal V1, and the shaped signal V2 is designated generally as 30. The shaped driving signal V2 is coupled to the input of a first high impedance buffer 32, which serves to isolate the phase detector 30 from the operation of the compressor analog 10. The reference driving signal V1 is coupled to a second isolation buffer 34. The output from the first buffer 32 is coupled to one input of a first voltage comparator 36. The second input of the voltage comparator 36 is coupled to a switch 38, which connects the second input to a calibrate circuit 40, or to ground. The calibrate circuit 40 is used to adjust the voltage level into the second input of the comparator 36. The output of the first comparator 36 is a square wave which changes value when the shaped driving signal V2 changes sign. A second voltage comparator 42 is coupled to the output of the second isolation buffer 34, and generates a square wave which switches each time the reference driving signal V1 changes between a positive and a negative value.

First and second pulse generators 44, 46 are coupled to the output of the first comparator 38. The first generator 44 creates a first pulse train output P1 consisting of a narrow pulse at each positive going transition of the square wave output of the first comparator 36. The second generator 46 creates a second pulse train output P2 consisting of a narrow positive pulse at each negative going transition of the square wave output of the first comparator 36. A third pulse generator 48 is coupled to the output of the second comparator 42, and generates a third pulse train output P3 consisting of a narrow pulse at each positive going transition of the output of the second comparator 42.

The outputs of the pulse generators 44, 46 and 48 are coupled to the inputs of three flip-flops 50, 52 and 54. The flip-flops can be, for example, S-R flip-flops or J-K flip-flops. In the preferred embodiment, S-R flip-flops are used, and the output from the first pulse generator 44 is coupled to the S input of the first flip-flop 50, and the output of the third pulse generator 48 is coupled to the R input. The S input of the second flip-flop 52 is coupled to the output of the third pulse generator 48, and the R input is coupled to the output of the second pulse generator 46. The outputs of the first pulse generator 44 and the second comparator 42 are combined in a logic control circuit 56, the output of which is coupled to the S input of the third flip-flop 54. The R input of the third flip-flop 54 is coupled to the output of the third pulse generator 48.

The output P4 of the first flip-flop 50 is a pulse train, and is coupled to a digital indicator 58 which indicates the phase difference between the leading and trailing edges of the output pulses. The indicator 58 displays the phase difference in degrees as a function of the duty cycle of the output P4. For example, if the duty cycle of the output P4 is 50 percent, the digital indicator 58 would register 180 degrees. The outputs P5 and P6 from the second and third flip-flops 52, 54 are also pulse trains, and are combined in a null-indicating meter 60, which indicates a null point when the pulses from the two flip-flops 52, 54 have the same length. The meter 60 gives a non-zero reading when the pulses of P5 and P6 have different lengths.

Figure 3:
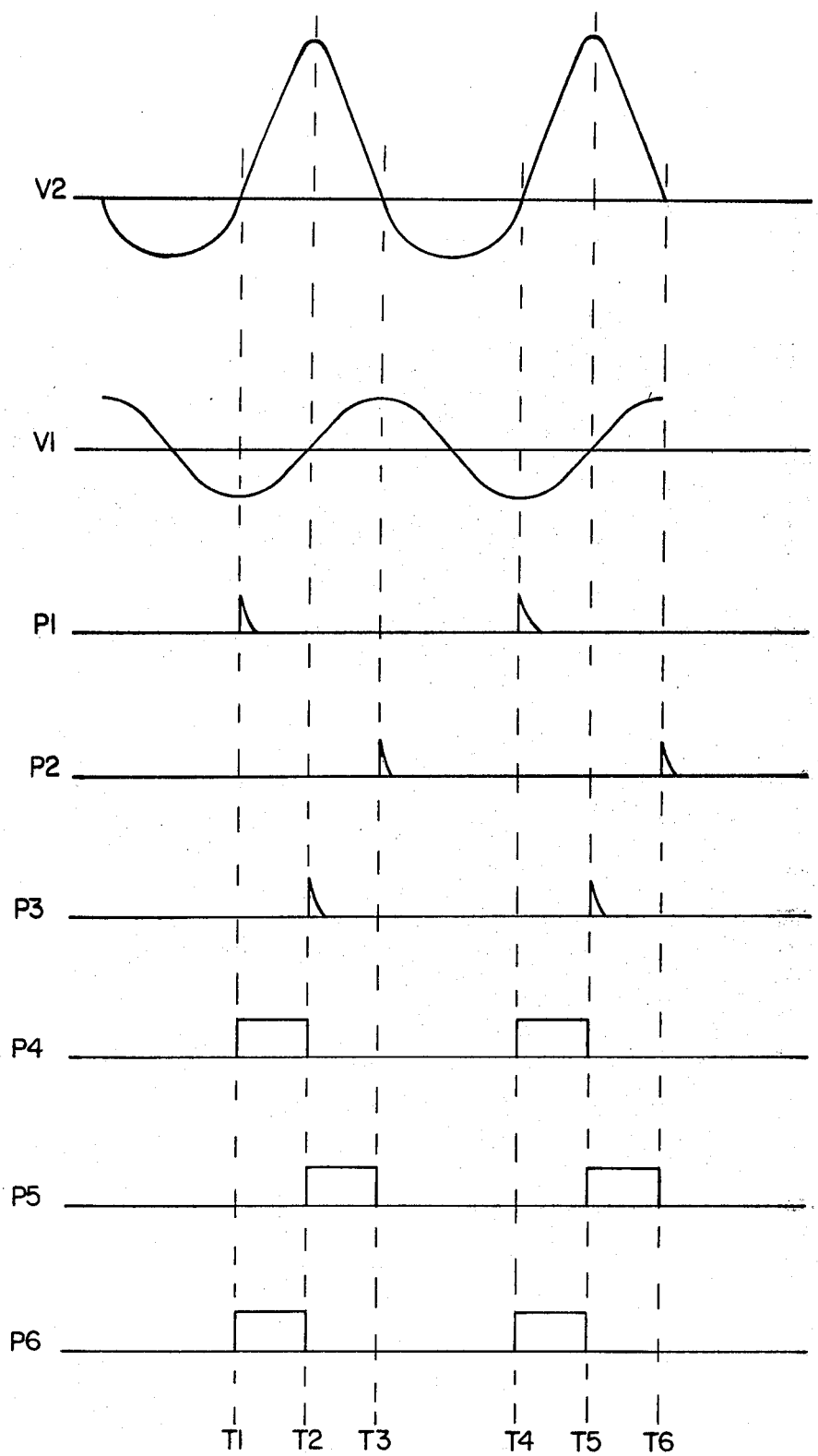

Referring to FIG. 3, several of the voltage waveforms occuring during the operation of the relative phase indicator 30 are shown. The horizontal line in each case represents the reference voltage, which is preferably ground. Due to the larger upper lobes, the DC voltage level of the shaped diving signal V2 is higher than the ground reference voltage. Conventional phase meters detect zero crossings of the waveforms past a selected voltage level. This operation is satisfactory where the two waveforms being compared have the same shape, but not when the waveforms are different. The problem is especially acute when multi-cylinder compressors are being modeled, because the driving signals for each cylinder may have to be shaped differently, and any given selected voltage level may intersect each waveform at a different part of its cycle. A conventional phasemeter will read the point where each signal crosses the selected voltage level as the same point in the cycle, which is not the case.

Since zero crossings of the shaped driving signal V2 cannot be used directly for phase measurements, the apparatus of the present invention calculates the phase of the driving signal V2 by assuming that the peak of the positive lobe occurs halfway between the positive and negative going transitions across any selected voltage level. The apparatus initially sets the phase difference between the reference signal V1 and the driving signal V2 by adjusting the phase of the driving signal V2 so that the upper lobe is centered over a positive going zero crossing of the reference signal V1. This event occurs when the two signals are 90 degrees out of phase, and the indicator 58 can be calibrated to read 90 degrees once this situation has been set up.

The improved phase detector operates generally by inferring the peaks of the shaped signal V2. By tracking the inferred peaks, the phase indicator 30 determines the phase relationship between the sinusoidal signal V1 and the shaped signal V2.

As discussed above and shown better in FIG. 3, the output pulses P1 from the first generator 44 occur at each positive going transition past the zero reference of the driving signal V2. The output pulses P2 from the second generator 46 occur at each negative going transition, and the output pulses P3 from the third generator 48 occur at each positive going transition of the reference signal V1. The output pulses P4 from the first flip-flop 50 reflect the phase difference between the positive going transitions of the driving signal V2 and the reference signal V1. The output from the first flip-flop 50 goes positive at time T1, and returns to zero at time T2, when the flip-flop is reset by the output of the third pulse generator 48. This repeats at times T4 and T5. The output of the third flip-flop 54 is also high between times T1 and T2, and times T4 and T5.

It will be appreciated by those skilled in the art that the output pulses from flip-flop 54 would have the same length when the driving signal V2 leads the reference signal V1 by 270 degrees and 90 degrees. To eliminate this ambiguity, the logic circuit 56 provides for triggering the S input of flip-flop 54 only when the output of the second comparator 42 is low. This may be accomplished, for example, by inverting the comparator 42 output, and logically ANDing the inverted comparator output with the first generator output P1.

The output P5 of the second flip-flop 52 goes high upon receipt of a pulse from the third generator 48, and rests upon the receipt of a pulse from the second generator 46. Thus, the time between T1 and T3 corresponds to that portion of the cycle that the driving signal V2 is positive. T2 corresponds to the time that the reference signal V1 crosses the reference voltage.

With the switch 38 in position one, the phase of the shaped driving signal V2 is controlled by adjusting the phase shifter 18 of FIG. 1. This phase is adjusted until the null meter 60 reads zero, which indicates that the outputs of the second and third flip-flops 52, 54 have the same duration. This corresponds to that point in time T2 where the reference signal V1 crosses zero at the same point that the driving signal V2 reaches the peak of its positive excursion. This occurs when the driving signal V2 and the reference signal V1 are 90 degrees out of phase.

The phase difference between the signals V1 and V2 has been determined by inferring the location of the peaks in V2, and comparing the phase of those peaks with the phase of V1 as determined by zero crossings. The locations of the peaks in V2 are inferred by assuming that the peaks occur halfway between the positive going and negative going transitions of V2 past any given DC reference voltage.

To operate the device 30, the phase of the driving signal V2 is adjusted so that the meter 60 reads zero. Then the switch 38 is moved to position two, and the calibrate circuit 40 adjusted to change the level into the second input of the first comparator 36. This has the effect, as seen in FIG. 3, of raising and lowering the reference voltage in relation to the waveform. This level is adjusted until the output P4 from the first flip-flop 50 has a duty cycle of 25 percent. This causes the digital indicator 58 to read 90 degrees, which is the present phase relationship between the driving signal V2 and the reference signal V1. The device 30 is now calibrated, and the phase of the driving signal V2 may now be adjusted by the phase shifter 18 to the desired relationship with the reference signal V1. The digital indicator 58 will continuously show the phase relationship between the driving signal V2 and reference signal V1.

Although a preferred embodiment has been described in detail, it should be understood that various substitutions, alterations, and modifications may become apparent to those skilled in the art. These changes may be made without departing from the spirit and scope of the invention as defined by the appended claims.

What is claimed is:

1. An apparatus for calibrating a pulse width reading phasemeter, comprising:
   means for generating first and second consecutive pulses, wherein the pulses exist while a driving signal voltge is higher than a first calibrating voltage, and wherein both the end of the first pulse and the beginning of the second pulse occur when a reference signal crosses a second calibrating voltage on a positive transition;

means for adjusting the relative phase between the driving and reference signals;

means for determining when the first and second pulses have the same width; and means for generating a third pulse having a width proportional to the phase difference between the reference and driving signals.

2. The apparatus of claim 1 for indicating the phase relationship between two signals, further comprising means for indicating the width of the third pulse.

3. An apparatus for determining the phase difference between a first and a second periodic waveform comprising:

a first voltage comparator coupled to the first waveform, said first comparator having a square wave output which changes value at each zero crossing of the first waveform;

a second voltage comparator coupled to the second waveform, said second comparator having a square wave output which changes value at each zero crossing of the second waveform;

first and second pulse generators coupled to the output of said first comparator, wherein said first pulse generator generates a pulse at each positive going transition of the first comparator output, and said second pulse generator generates a pulse at each negative going transition of the first comparator output;

a third pulse generator coupled to the output of said second comparator, said third generator generating a pulse at each positive going transition of the second comparator output;

logic means coupled to the output of said second comparator and to the output of said first generator for generating a positive pulse synchronous with the first generator pulses which occur while the output of said second comparator is low;

a first flip-flop having a first input coupled to the output of said first pulse generator and a second input coupled to the output of said third pulse generator;

a second flip-flop having a first input coupled to the output of said second pulse generator and a second input coupled to the output of said third pulse generator;

a third flip-flop having a first input coupled to the output of said logic means and having a second input coupled to the output of said third pulse generator;

means for indicating the length of the output pulses generated by said first flip-flop; and, means coupled to the outputs of said second and third flip-flops for indicating when output pulses generated by said second and said third flip-flops have the same length.

4. A method for determining the phase relationship between a shaped signal and a reference signal, comprising the steps of:

generating a first pulse having a width proportional to the phase difference between a positive transition of the shaped signal past a first calibrate voltage level and a positive transition of the reference signal past a second calibrate voltage;

generating a second pulse having a width proportional to the phase difference between a positive transition of the reference signal past the second calibrate voltage and a negative transition of the shaped signal past the first calibrate voltage;

adjusting the phase difference between the shaped and reference signals so that the first and second pulses have equal width;

generating a third pulse having a width proportional to the phase difference between a positive transition of the shaped signal past the first calibrate voltage and a positive transition of the reference signal past the second calibrate voltage; and adjusting the first calibrate voltage level until the third pulse has a width of 90 degrees.

5. The method of claim 4 further comprising the step of indicating the phase difference between the shaped and reference signals as a function of the third pulse width.

* * * * *